United States Patent
Kim et al.

[11] Patent Number: 6,104,662
[45] Date of Patent: Aug. 15, 2000

[54] DATA MASKING SYSTEMS AND METHODS FOR INTEGRATED CIRCUIT MEMORY DEVICES INCLUDING PULSE-RESPONSIVE EQUALIZERS AND PRECHARGERS

[75] Inventors: Jong-ryeul Kim; Kyung-woo Kang, both of Kyungki-do, Rep. of Korea

[73] Assignee: Samsung Electronics Co., Ltd., Rep. of Korea

[21] Appl. No.: 09/405,746

[22] Filed: Sep. 27, 1999

[30] Foreign Application Priority Data

Jan. 16, 1999 [KR] Rep. of Korea .................. 99-1180

[51] Int. Cl.[7] ............................................. G11C 8/00
[52] U.S. Cl. ................................. 365/230.03; 365/203
[58] Field of Search ............... 365/230.03, 203, 365/204, 189.05, 191, 233

[56] References Cited

U.S. PATENT DOCUMENTS

| | | | |
|---|---|---|---|
| 5,404,338 | 4/1995 | Murai et al. | 365/233 |
| 5,517,462 | 5/1996 | Iwamoto et al. | 365/233 |
| 5,703,828 | 12/1997 | Park et al. | 365/230.03 |
| 5,844,848 | 12/1998 | Cho | 365/190 |

*Primary Examiner*—Son Mai
*Attorney, Agent, or Firm*—Myer Bigel Sibley & Sajovec

[57] ABSTRACT

Data masking is performed for an integrated circuit memory device, by generating a pulse in response to a data masking signal that is received on one of a plurality of data masking pins, equalizing a plurality of groups of input/output line pairs during the pulse and precharging the plurality of groups of input/output line pairs during the pulse. The group of input/output line pairs that correspond to the data masking signal then is precharged after the pulse in response to the data masking signal that is received on the one of the plurality of data masking pins. The input and output line drivers also preferably are deactivated during the pulse and the input and output line drivers, except for the group of input and output line drivers that correspond to the one of the plurality of data masking pins, preferably are activated after the pulse. Accordingly, the input and output line pairs that correspond to data input and output pins to be masked may be precharged during the pulse, and they may be continuously precharged after the pulse. Thus, even though the input and output line pairs may have a large resistance, they can be sufficiently precharged upon masking of write data.

10 Claims, 5 Drawing Sheets

DATA MASKING SYSTEMS AND METHODS FOR INTEGRATED CIRCUIT MEMORY DEVICES INCLUDING PULSE-RESPONSIVE EQUALIZERS AND PRECHARGERS

FIELD OF THE INVENTION

This invention relates to integrated circuit memory devices and operating methods therefor, more particularly to data masking systems and methods for integrated circuit memory devices.

BACKGROUND OF THE INVENTION

Integrated circuit memory devices are widely used in consumer and commercial applications. One widely used integrated circuit memory device is a synchronous Dynamic Random Access Memory (synchronous DRAM device. Synchronous DRAMs may be used for the main memory of a computer system, and also may be used in graphics applications. In particular, a byte-wide synchronous DRAM, i.e., a synchronous DRAM having a data path width of X16 or wider, may be used in graphics applications. Here, X16 denotes that 16 bits of data can be simultaneously input or output. Synchronous DRAMs may include a data masking function to mask data that is input via data input and output pins (typically called "DQ pins") from an external source. The data masking generally is performed in units of 8 bits.

For example, in the case of a synchronous DRAM having a data path width of X16, there are generally two data masking pins (typically called "DQM pins") from which data masking signals are input. These DQM pins comprise a lower DQM (LDQM) pin and an upper DQM (UDQM) pin. The LDQM pin masks data input via data input and output pins DQ0 through DQ7, i.e., the lower 8 bits of 16 bits that are input via 16 data input and output pins DQ1 through DQ15. The UDQM pin masks the upper 8 bits, i.e., data input via data input and output pins DQ8 through DQ15. It will be understood that as used herein, the term pins includes any input/output structure for an integrated circuit device and can include pads, optical input/output structures and other conventional input/output structures.

In the case of a synchronous DRAM having a data path width of X32, there are generally four data masking pins DQM0 through DQM3 via which data masking signals are input. The data masking pin DQM0 masks 8 bits of 32 bits that are input via 32 data input and output pins DQ0 through DQ31, i.e., data that is input via data input and output pins DQ0 through DQ7. The data masking pin DQM1 masks 8 bits that are input via data input and output pins DQ8 through DQ15, the data masking pin DQM2 masks 8 bits that are input via data input and output pins DQ16 through DQ23, and the data masking pin DQM3 masks 8 bits that are input via data input and output pins DQ24 through DQ31.

FIG. 1 is a block diagram showing DQ allocation and bank allocation in a conventional 2M(Mega)X32 DRAM. Referring to FIG. 1, the 2MX32 DRAM is divided into four banks, i.e., bank A through bank D, each comprised of 16M blocks. Accordingly, 32 DQ pins, which are controlled by four data masking pins, all are allocated to one column selection line (CSL).

In a highly integrated DRAM having such a configuration, when a data masking signal is input to any one data masking pin upon masking of read data, output buffers connected to 8 data input and output pins corresponding to the data masking signal are disabled, thereby masking the read data. When a data masking signal is input to any one data masking pin upon masking of write data, 8 input and output line pairs connected to 8 data input and output pins corresponding to the data masking signal are precharged, and input and output line drivers for driving the input and output line pairs are turned off. In this way, the write data is masked.

However, in a highly integrated DRAM having such a configuration, the input and output line pairs typically are formed of tungsten (W), so that the resistances of the input and output line pairs may increase with a reduction in the size of the integrated circuit. Thus, the input and output line pairs may not be precharged sufficiently upon masking of write data. Hence, masking of write data may not be performed properly.

SUMMARY OF THE INVENTION

It is therefore an object of the present invention to provide improved data masking systems and methods for integrated circuit memory devices.

It is another object of the present invention to provide data masking systems and methods for integrated circuit devices that can properly mask write data, notwithstanding the large resistance of input and output line pairs in the integrated circuit.

These and other objects can be provided, according to the present invention, by generating a pulse in response to a data masking signal that is received on one of a plurality of data masking pins, equalizing a plurality of groups of input/output line pairs during the pulse and precharging the plurality of groups of input/output line pairs during the pulse. The group of input/output line pairs that correspond to the data masking signal then is precharged after the pulse in response to the data masking signal that is received on the one of the plurality of data masking pins. The input and output line drivers also preferably are deactivated during the pulse and the input and output line drivers, except for the group of input and output line drivers that correspond to the one of the plurality of data masking pins, preferably are activated after the pulse. Accordingly, the input and output line pairs that correspond to data input and output pins to be masked may be precharged during the pulse, and they may be continuously precharged after the pulse. Thus, even though the input and output line pairs may have a large resistance, they can be sufficiently precharged upon masking of write data.

More specifically, integrated circuit memory devices according to the present invention include a plurality of banks of memory cells, a plurality of groups of data input/output pins, a respective group of which corresponds to a respective bank of memory cells, and a plurality of data masking pins, a respective one of which corresponds to a respective bank of memory cells. A plurality of groups of input/output line pairs also is provided, a respective group of which is responsive to a respective group of data input/output pins and to a respective bank of memory cells, to input and output data between the plurality of groups of data input/output pins and the plurality of banks of memory cells. A pulse generation circuit generates a pulse in response to a data masking signal that is received on one of the plurality of data masking pins. An equalizing circuit is responsive to the pulse generation circuit, to equalize the plurality of groups of input/output line pairs during the pulse. A first precharging circuit is responsive to the pulse generation circuit to precharge the plurality of groups of input/output line pairs during the pulse. A second precharging circuit is responsive to the data masking signal that is received on one of the plurality of data masking pins, to precharge the corresponding group of input/output line pairs after the pulse.

An integrated circuit memory device according to the present invention also preferably includes a plurality of groups of input and output line drivers that drive the corresponding plurality of groups of input/output line pairs. A circuit also is included that is responsive the pulse generation circuit, to deactivate the plurality of groups of input and output line drivers during the pulse and to activate the plurality of groups of input and output line drivers except for the group of input and output line drivers that correspond to the one of the plurality of data masking pins, after the pulse.

The pulse generation circuit preferably comprises a plurality of pulse generators, a respective one of which is responsive to a data masking signal on a respective one of the data masking pins. A logic circuit is responsive to the plurality of pulse generators, to generate the pulse in response to any of the plurality of pulse generators.

The equalizing circuit preferably comprises a plurality of groups of equalizers. A respective equalizer preferably comprises a field effect transistor that is connected between a corresponding input/output line pair, the gate of which is responsive to the pulse.

The first precharging circuit preferably comprises a plurality of groups of first prechargers. Each first precharger preferably comprises first and second field effect transistors that are serially connected between a corresponding input/output line pair, the gates of which are responsive to the pulse.

The second precharging circuit preferably comprises a plurality of groups of second prechargers. Each second precharger preferably includes first and second field effect transistors that are serially connected between a corresponding input/output line pair, the gates of which are responsive to the data masking signal that is received on the corresponding data masking pin. A third field effect transistor is connected between the corresponding input output line pair, the gate of which is responsive to the data masking signal that is received on the corresponding data masking pin. Accordingly, masking operations can be performed at high speeds in integrated circuit memory devices having wide data paths, notwithstanding the large resistance of the input and output line pairs.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Each embodiment described and illustrated herein includes its complementary conductivity type embodiment as well.

Figure 1:
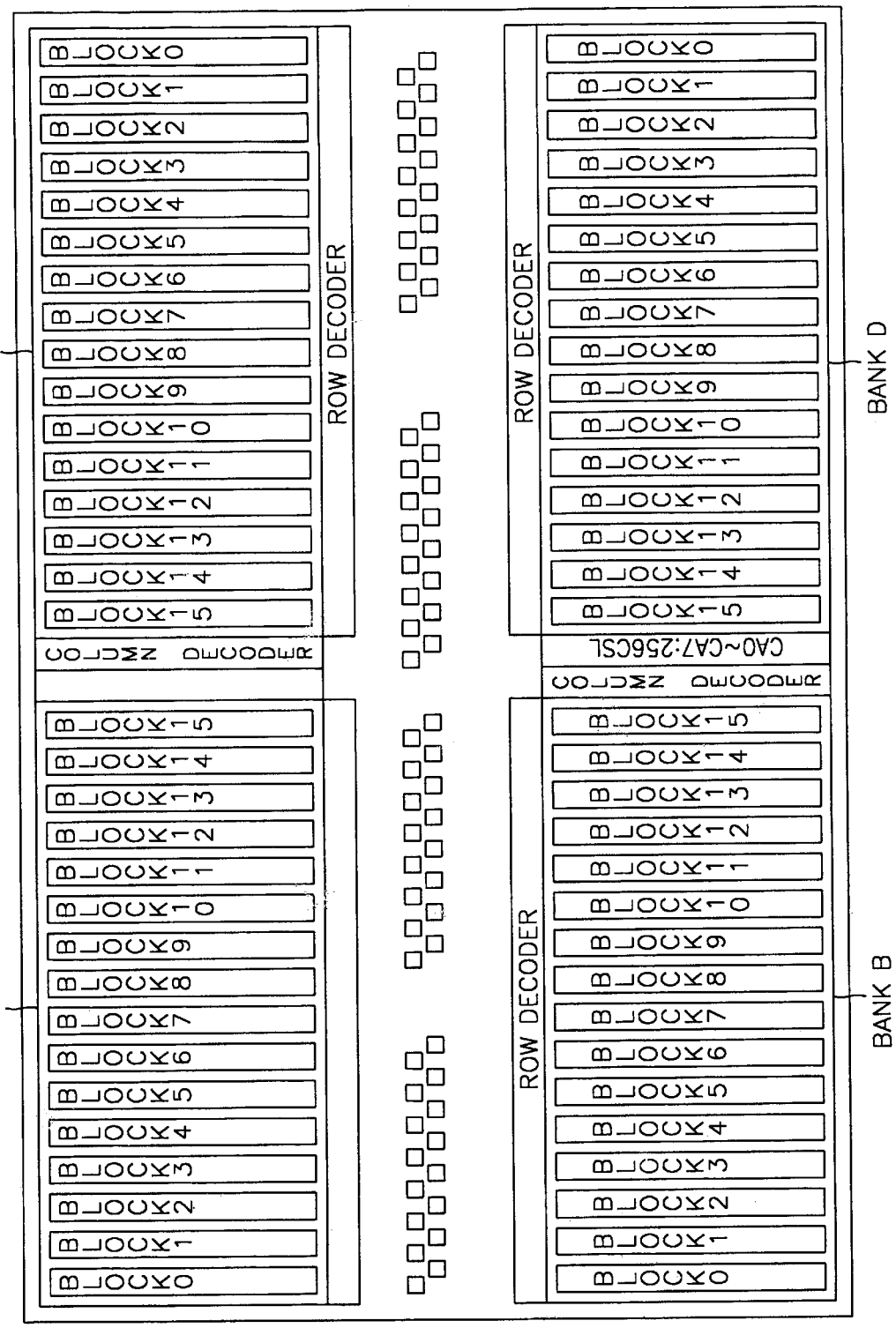
FIG. 1 is a block diagram of a conventional typical 2MX32 DRAM.
Figure 2:
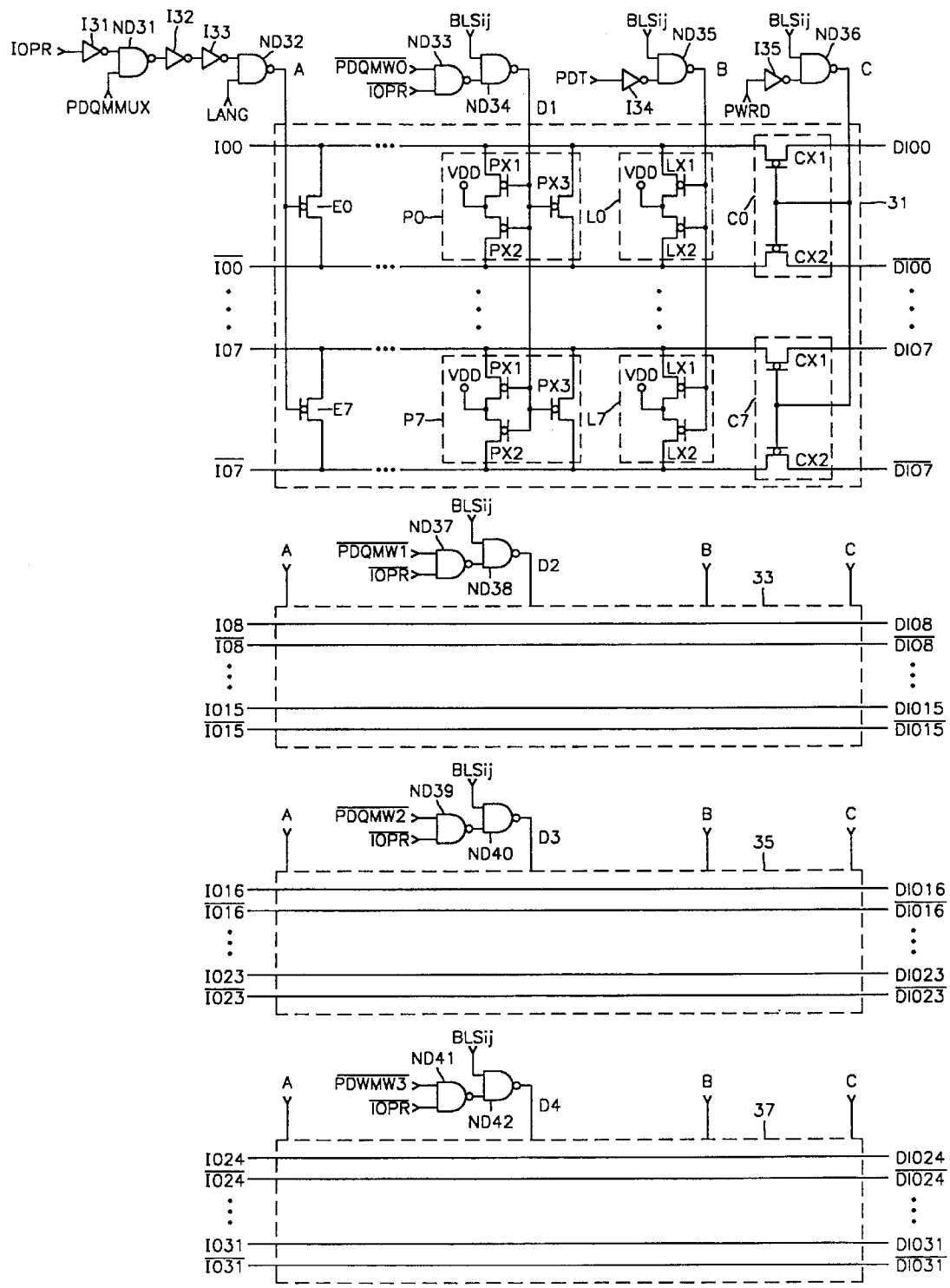
FIG. 2 is a diagram illustrating input and output multiplexers including equalizers and precharging circuits for memory devices according to the present invention.

FIG. 2 illustrates input and output MUXes (multiplexers) 31 through 37, including equalizers and precharging circuits, in a memory device according to the present invention. In FIG. 2, the case of an X32 DRAM as shown in FIG. 1 is illustrated, and four data masking pins DQM0 through DQM3, 32 data input and output pins DQ0 through DQ31, and 32 input and output line pairs IO0/$\overline{IO0}$ through IO31/$\overline{IO31}$ corresponding to the data input and output pins DQ0 through DQ31 are assumed to be present.

Referring to FIG. 2, equalizers E0 through E7 of the input and output MUXes 31 through 37 equalize all of the 32 input and output line pairs IO0/$\overline{IO0}$ through IO31/$\overline{IO31}$ in response to a signal A. Each of the equalizers E0 through E7 is connected between the corresponding input and output line pairs among the input and output line pairs IO0/$\overline{IO0}$ through IO31/$\overline{IO31}$, and preferably is comprised of a PMOS transistor having a gate to which the signal A is applied.

First precharging circuits L0 through L7 of the input and output MUXes 31 through 37 precharge all of the 32 input and output line pairs IO0/$\overline{IO0}$ through IO31/$\overline{IO31}$ in response to a signal B. Each of the first precharging circuits L0 through L7 is connected in series between a corresponding input and output line pair among the input and output line pairs IO0/$\overline{IO0}$ through IO31/$\overline{IO31}$, and preferably includes PMOS transistors LX1 and LX2 having gates to which the signal B is applied. A power supply voltage VDD preferably is applied to a connection point between the PMOS transistors LX1 and LX2.

Second precharging circuits P0 through P7 of the input and output MUXes 31 through 37 equalize and precharge only corresponding input and output line pairs among the input and output line pairs IO0/$\overline{IO0}$ through IO31/$\overline{IO31}$. That is, the second precharging circuits P0 through P7 of the input and output MUX 31 equalize and precharge the input and output line pairs IO0/$\overline{IO0}$ through IO7/$\overline{IO7}$ in response to a signal D1. The second precharging circuits P0 through P7 of the input and output MUX 33 equalize and precharge the input and output line pairs IO8/$\overline{IO8}$ through IO15/$\overline{IO15}$ in response to a signal D2. The second precharging circuits P0 through P7 of the input and output MUX 35 equalize and precharge the input and output line pairs IO16/$\overline{IO16}$ through IO23/$\overline{IO23}$ in response to a signal D3. The second precharging circuits P0 through P7 of the input and output MUX 37 equalize and precharge the input and output line pairs IO24/$\overline{IO24}$ through IO31/$\overline{IO31}$ in response to a signal D4. Each of the second precharging circuits P0 through P7 of the input and output MUXes 31 through 37 preferably includes PMOS transistors PX1, PX2 and PX3. The PMOS transistors PX1 and PX2 preferably are serially connected between a corresponding input and output line pair among the input and output line pairs IO16/$\overline{IO16}$ through IO23/$\overline{IO23}$, and each has a gate to which a corresponding signal among the signals D1, D2, D3 and D4 preferably is applied. The power supply voltage VDD preferably is applied to the connection point between the PMOS transistors PX1 and PX2.

Switching circuits C0 through C7 of the input and output MUXes 31 through 37 connect the input and output line pairs IO0/$\overline{IO0}$ through IO31/$\overline{IO31}$ to data input and output line pairs DIO0/$\overline{DIO0}$ through DIO31/$\overline{DIO31}$ in response to a signal C. Each of the switching circuits C0 through C7 preferably includes PMOS switching transistors CX1 and CX2. The PMOS switching transistor CX1 preferably is connected between a line among the input and output lines IO0 through IO31 and a corresponding line among the data input and output lines DIO0 through DIO31. The PMOS switching transistor CX2 preferably is connected between a line among the complementary input and output lines $\overline{\text{IO0}}$ through $\overline{\text{IO31}}$ and a corresponding line among the complementary data input and output lines $\overline{\text{DIO0}}$ through $\overline{\text{DIO31}}$. The signal C preferably is applied to the gates of the PMOS switching transistors CX1 and CX2.

Figure 3:
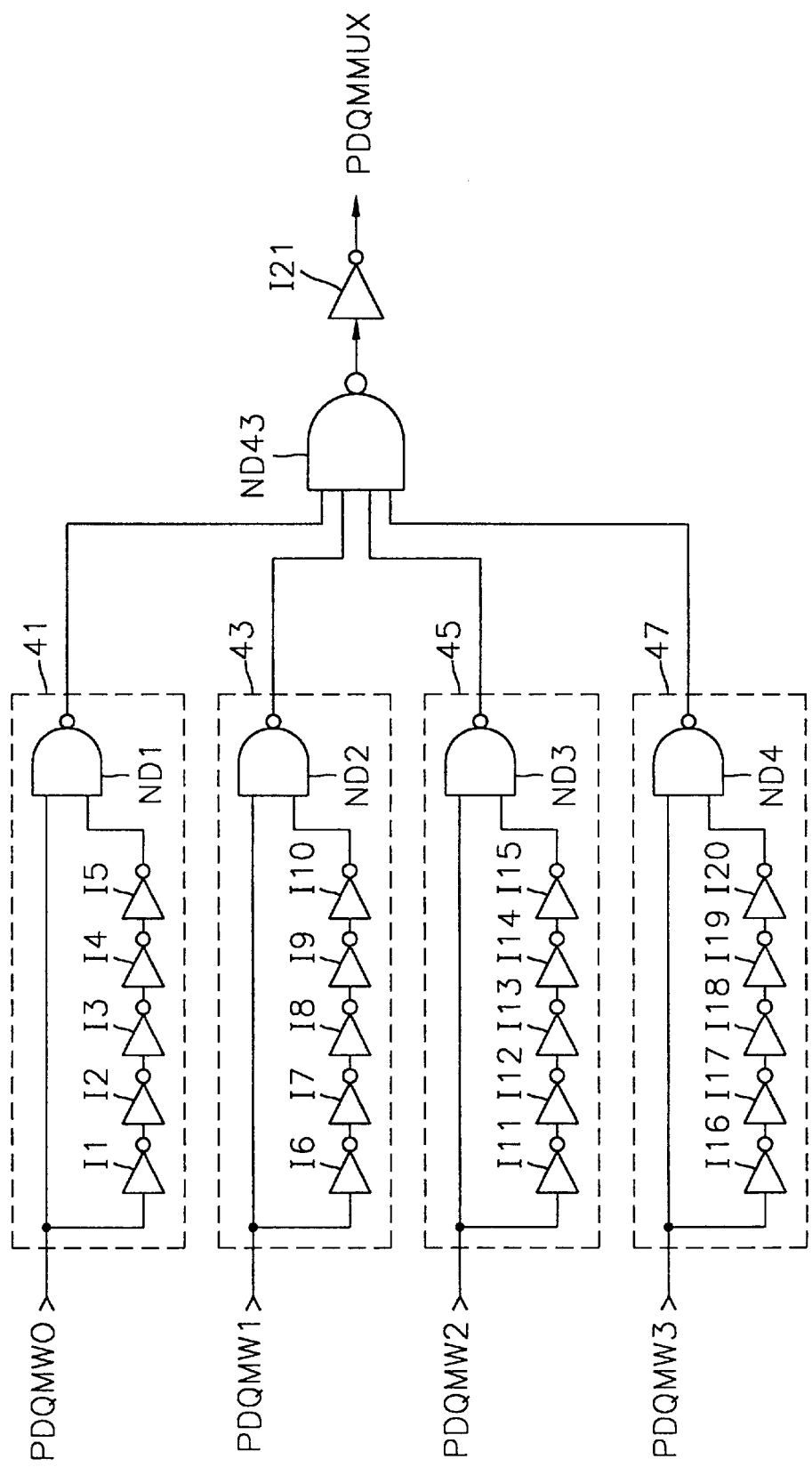
FIG. 3 is a circuit diagram of a pulse signal generation circuit according to the present invention.

Signals IOPR and LANG in FIG. 2 do not relate to the masking of write data, and they are respectively logic "low" and logic "high" upon masking of write data. Accordingly, a pulse signal PDQMMUX is buffered through a NAND gate ND31, inverters I32 and I33, and a NAND gate ND32 and output as the signal A upon masking of write data. The pulse signal PDQMMUX is generated in response to a data masking signal that is input to one pin of the four data masking pins DQM0 through DQM3. The pulse signal PDQMMUX preferably is a negative pulse signal which is generated when one of the data masking signals PDQMW0 through PDQMW3 becomes logic "high", as shown in FIG. 3.

The data masking signal PDQMW0 is input via the data masking pin DQM0, and masks data input via the data input and output pins DQ0 through DQ7. The data masking signal PDQMW1 is input via the data masking pin DQM1, and masks data input via the data input and output pins DQ8 through DQ15. The data masking signal PDQMW2 is input via the data masking pin DQM2, and masks data input via the data input and output pins DQ16 through DQ23. The data masking signal PDQMW3 is input via the data masking pin DQM3, and masks data input via the data input and output pins DQ24 through DQ31.

Figure 4:
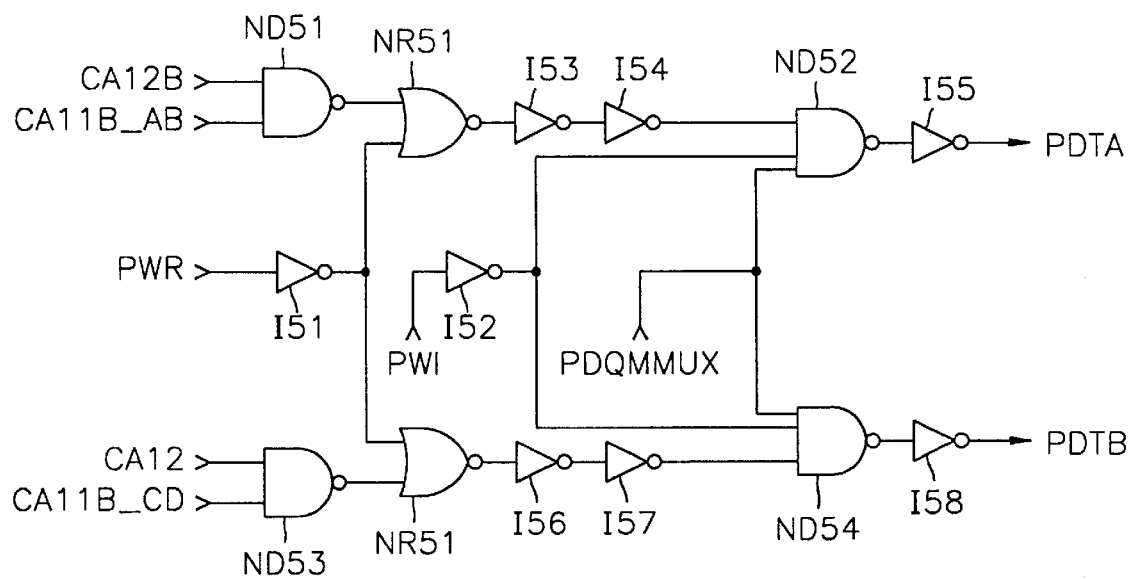
FIG. 4 is a circuit diagram of a circuit for generating a signal PDT shown in FIG. 2.

A block selection signal BLSij preferably is activated to logic "high" when predetermined blocks in a bank are selected. Accordingly, a signal PDT is buffered through an inverter I34 and a NAND gate ND35 and is output as the signal B upon masking of write data. The signal PDT, as can be seen from FIG. 4, is one of signals PDTA and PDTB obtained by buffering the pulse signal PDQMMUX upon masking of write data.

A signal $\overline{\text{PDQMW0}}$ is an inverted signal of the data masking signal PDQMW0, and is buffered by NAND gates ND33 and ND34 and output as the signal D1. A signal $\overline{\text{PDQMW1}}$ is an inverted signal of the data masking signal PDQMW1, and is buffered by NAND gates ND37 and ND38 and output as the signal D2. A signal $\overline{\text{PDQMW2}}$ is an inverted signal of the data masking signal PDQMW2, and is buffered by NAND gates ND39 and ND40 and output as the signal D3. A signal $\overline{\text{PDQMW3}}$ is an inverted signal of the data masking signal PDQMW3, and is buffered by NAND gates ND41 and ND42 and output as the signal D4.

A write control signal PWRD preferably is logic "low" upon writing. Thus, the signal PWRD is logic "low", and the signal BLSij is logic "high" upon masking of write data, so that the signal C applied to the gates of the PMOS switching transistors CX1 and CX2 preferably becomes logic "low".

FIG. 3 is a circuit diagram of a pulse signal generation circuit in a memory device according to the present invention. Referring to FIG. 3, the pulse signal generation circuit includes four automatic pulse signal generators 41, 43, 45 and 47, a NAND gate ND43, and an inverter I21.

The automatic pulse signal generator 41 includes a NAND gate ND1 and an inversion delay preferably comprised of an odd number of inverters I1 through I5, and automatically generates a negative pulse signal when the data masking signal PDQMW0 becomes logic "high". The automatic pulse signal generator 43 includes a NAND gate ND2 and an inversion delay preferably comprised of an odd number of inverters I6 through I10, and automatically generates a negative pulse signal when the data masking signal PDQMW1 becomes logic "high". The automatic pulse signal generator 45 includes a NAND gate ND3 and an inversion delay preferably comprised of an odd number of inverters I11 through I15, and automatically generates a negative pulse signal when the data masking signal PDQMW2 becomes logic "high". The automatic pulse signal generator 47 includes a NAND gate ND4 and an inversion delay preferably comprised of an odd number of inverters I16 through I20, and automatically generates a negative pulse signal when the data masking signal PDQMW3 becomes logic "high". The NAND gate ND43 receives the output signals of the automatic pulse signal generators 41, 43, 45 and 47 and performs a NAND operation, and the inverter I21 inverts the output of the NAND gate ND43 and outputs the pulse signal PDQMMUX. It will be understood that other automatic pulse generating circuits may be used.

Accordingly, when a data masking signal is input to one pin of the four data masking pins DQM0 through DQM3, i.e., when one signal of the data masking signals PDQMW0 through PDQMW3 is logic "high", a negative pulse is generated as the pulse signal PDQMMUX.

FIG. 4 is a circuit diagram of a circuit for generating the signal PDT of FIG. 2. Referring to FIG. 4, the circuit includes NAND gates ND51 through ND54, NOR gates NR51 and NR52 and inverters I51 through I58.

Upon masking of write data, signals CA12B, CA11B_AB, CA12, CA11B_CD, and PWR preferably all are logic "high", and a signal PWI preferably is logic "low". Thus, upon masking of write data, the pulse signal PDQMMUX is buffered by the NAND gate 52 and the inverter I55 and output as the signal PDTA, and also is buffered by the NAND gate N54 and the inverter I58 and output as the signal PDTB. The signal PDT of FIG. 2 either is the signal PDTA or the signal PDTB. The signal PDTA denotes a signal relating to a bank A, and the signal PDTB denotes a signal relating to a bank B.

Figure 5:
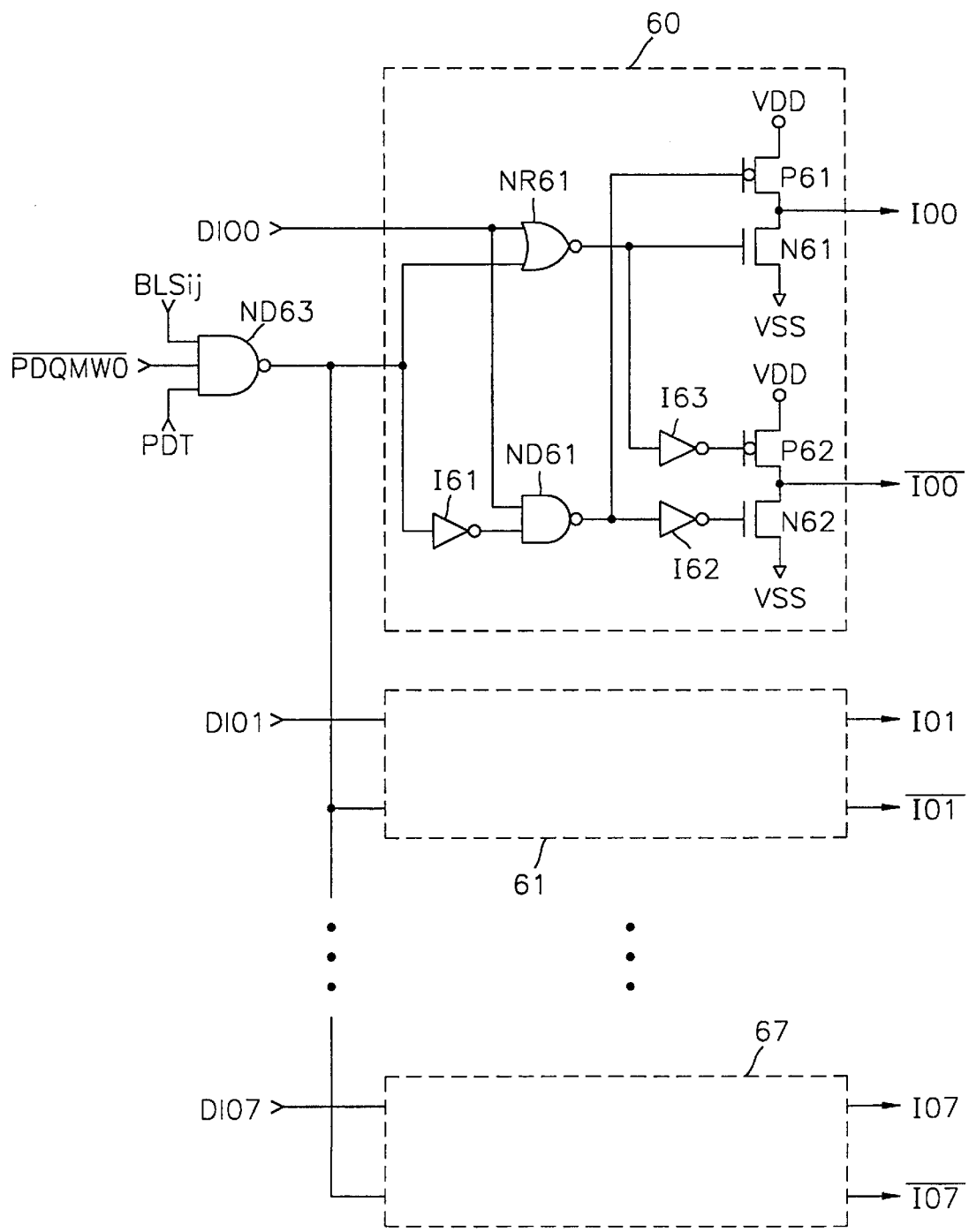
FIG. 5 is a circuit diagram of input and output line drivers for memory devices according to the present invention.

FIG. 5 is a circuit diagram of input and output line drivers in a memory device according to the present invention. For clarity, only input and output line drivers for driving the input and output line pairs IO0/$\overline{\text{IO0}}$ through IO7/$\overline{\text{IO7}}$ are shown.

Referring to FIG. 5, each of input and output line drivers 60 through 67 includes a NOR gate NR61, a NAND gate ND61, inverters I61, I62 and I63, PMOS pull-up transistors P61 and P62, and NMOS pull-down transistors N61 and N62. Each of the input and output line drivers 60 through 67 is controlled by the output of a NAND gate ND63 which receives the block selection signal BLSij, the inverted signal $\overline{\text{PDQMW0}}$ of the data masking signal PDQMW0, and the signal PDT.

Accordingly, when the data masking signal PDQMW0 is logic "high", i.e., when the inverted signal $\overline{\text{PDQMW0}}$ is logic "low", the PMOS pull-up transistors P61 and P62 and the NMOS pull-down transistors N61 and N62 are turned off. In other words, the eight input and output line drivers 60 through 67 for driving the eight input and output line pairs IO0/$\overline{\text{IO0}}$ through IO7/$\overline{\text{IO7}}$ are turned off.

When the data masking signal PDQMW1 is logic "high", eight input and output line drivers for driving the eight input and output line pairs IO8/$\overline{IO8}$ through IO15/$\overline{IO15}$ are turned off. When the data masking signal PDQMW2 is logic "high", eight input and output line drivers for driving the eight input and output line pairs IO16/$\overline{IO16}$ through IO23/$\overline{IO23}$ are turned off. When the data masking signal PDQMW3 is logic "high", eight input and output line drivers for driving the eight input and output line pairs IO24/$\overline{IO24}$ through IO31/$\overline{IO31}$ are turned off.

Meanwhile, even during the negative pulse section of the signal PDT obtained by buffering the pulse signal PDQMMUX, the PMOS pull-up transistors P61 and P62 and the NMOS pull-down transistors N61 and N62 are turned off. That is, during the negative pulse section of the signal PDT, the input and output line drivers 60 through 67 are all turned off. In other words, upon masking of write data, the 32 input and output line drivers for driving the 32 input and output line pairs IO0/$\overline{IO0}$ through IO31/$\overline{IO31}$ are turned off in the negative pulse section of the signal PDT.

Write data masking of a memory device according to the present invention now will be described referring to FIGS. 2 through 5. The case when the data masking signal PDQMW0 is input in a logic "high" state via the data masking pin DQM0 will be described.

When the data masking signal PDQMW0 is in a logic "high" state, the pulse signal PDQMMUX having a negative pulse is generated as shown in FIG. 3. Thus, the pulse signal PDQMMUX is buffered and output as the signal A as shown in FIG. 2, and all of the input and output line pairs IO0/$\overline{IO0}$ through IO31/$\overline{IO31}$ are equalized by the equalizers E0 through E7 of the input and output MUXes 31 through 37 in the negative pulse section of the pulse signal PDQMMUX. The pulse signal PDQMMUX is buffered and output as the signal PDT as shown in FIG. 4, and the signal PDT is buffered and output as the signal B as shown in FIG. 2. Thus, all of the input and output line pairs IO0/$\overline{IO0}$ through IO31/$\overline{IO31}$ are precharged, for example to the power supply voltage VDD, by the first precharging circuits L0 through L7 of the input and output MUXes 31 through 37 in the negative pulse section of the pulse signal PDQMMUX. Here, as shown in FIG. 5, the 32 input and output line drivers for driving the input and output line pairs IO0/$\overline{IO0}$ through IO31/$\overline{IO31}$ are all turned off in the negative pulse section of the signal PDT, i.e., in the negative pulse section of the pulse signal PDQMMUX, thereby preventing DC from passing between the input and output line drivers and the input and output MUXes 31 through 37.

When the data masking signal PDQMW0 is logic "high", the inverted signal $\overline{PDQMW0}$ of the data masking signal is logic "low". Thus, 8 input and output line drivers for driving the 8 input and output line pairs IO0/$\overline{IO0}$ through IO7/$\overline{IO7}$ are turned off as shown in FIG. 5. Also, only the signal D1 among the signals D1 through D4 becomes logic "low", and only the input and output line pairs IO0/$\overline{IO0}$ through IO7/$\overline{IO7}$ prbeferably are equalized and precharged, for example to the power supply voltage VDD, by the second precharging circuits P0 through P7 of the input and output MUX 31. That is, only the input and output line pairs IO0/$\overline{IO0}$ through IO7/$\overline{IO7}$ corresponding to the data input and output pins DQ0 through DQ7 preferably are equalized and precharged to the power supply voltage VDD.

To be more specific, in a memory device according to the present invention, the input and output line pairs IO0/$\overline{IO0}$ through IO31/$\overline{IO31}$ preferably are all equalized and precharged to the power supply voltage VDD in the negative pulse section of the pulse signal PDQMMUX, upon masking of write data. Also, only the input and output line pairs IO0/$\overline{IO0}$ through IO7/$\overline{IO7}$ corresponding to the data masking signal PDQMW0, i.e., corresponding to the data input and output pins DQ0 through DQ7 are again equalized and precharged to the power supply voltage VDD.

Next, when the pulse signal PDQMMUX becomes positive, i.e., logic "high", the equalizers E0 through E7 and the first precharging circuits L0 through L7 of the input and output MUXes 31 through 37 are all turned off. All the input and output line drivers except the eight input and output line drivers 60 through 67 for driving the eight input and output line pairs IO0/$\overline{IO0}$ through IO7/$\overline{IO7}$ are turned on. Thus, only the eight input and output line pairs IO0/$\overline{IO0}$ through IO7/$\overline{IO7}$ corresponding to the data masking signal PDQMW0, i.e., corresponding to the data input and output pins DQ0 through DQ7 remain in the precharged state, and precharging of the remaining input and output line pairs IO8/$\overline{IO8}$ through IO31/$\overline{IO31}$ is stopped.

Since the input and output line pairs IO0/$\overline{IO0}$ through IO7/$\overline{IO7}$ continue being precharged, data input via the data input and output pins DQ0 through DQ7 is masked, and data input via the data input and output pins DQ8 through DQ31 is written to a memory cell array via the input and output line pairs IO8/$\overline{IO8}$ through IO31/$\overline{IO31}$.

In integrated circuit memory devices according to the present invention as described above, input and output line pairs corresponding to data input and output pins to be masked are concurrently precharged by the first and second precharging circuits during pulse, and after the pulse, they are continuously precharged by the second precharging circuits. Therefore, while the resistance of the input and output line pairs may be large in a device structure having large data path width such as X32 or more, the input and output line pairs can be sufficiently precharged during masking of write data, allowing write data to be masked properly.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:

a plurality of banks of memory cells;

a plurality of groups of data input/output pins, a respective group of which corresponds to a respective bank of memory cells;

a plurality of data masking pins, a respective one of which corresponds to a respective bank of memory cells;

a plurality of groups of input/output line pairs, a respective group of which is responsive to a respective group of data input/output pins and to a respective bank of memory cells to input and output data between the plurality of groups of data input/output pins and the plurality of banks of memory cells;

a pulse generation circuit that generates a pulse in response to a data masking signal that is received on one of the plurality of data masking pins;

an equalizing circuit that is responsive to the pulse generation circuit to equalize the plurality of groups of input/output line pairs during the pulse;

a first precharging circuit that is responsive to the pulse generation circuit to precharge the plurality of groups of input/output line pairs during the pulse; and a second precharging circuit that is responsive to the data masking signal that is received on one of the plurality of data masking pins to precharge the corresponding group of input/output lines pairs after the pulse.

2. An integrated circuit memory device according to claim 1 further comprising:

a plurality of groups of input and output line drivers that drive the corresponding plurality of groups of input/output line pairs; and a circuit that is responsive to the pulse generation circuit to deactivate the plurality of groups of input and output line drivers during the pulse and to activate the plurality of groups of input and output line drivers except for the group of input and output line drivers that correspond to the one of the plurality of data masking pins after the pulse.

3. An integrated circuit memory device according to claim 1 wherein the pulse generation circuit comprises:

a plurality of pulse generators, a respective one of which is responsive to a data masking signal on a respective one of the data masking pins; and a logic circuit that is responsive to the plurality of pulse generators to generate the pulse in response to any of the plurality of pulse generators.

4. An integrated circuit memory according to claim 1 wherein the equalizing circuit comprises a plurality of groups of equalizers, a respective equalizer comprising:

a field effect transistor that is connected between a corresponding input/output line pair, the gate of which is responsive to the pulse.

5. An integrated circuit memory according to claim 1 wherein the first precharging circuit comprises a plurality of groups of first prechargers, each first precharger comprising:

first and second field effect transistors that are serially connected between a corresponding input/output line pair, the gates of which are responsive to the pulse.

6. An integrated circuit memory according to claim 1 wherein the second precharging circuit comprises a plurality of groups of second prechargers, each second precharger comprising:

first and second field effect transistors that are serially connected between a corresponding input/output line pair, the gates of which are responsive to the data masking signal that is received on the corresponding data masking pin; and a third field effect transistor that is connected between the corresponding input/output line pair, the gate of which is responsive to the data masking signal that is received on the corresponding data masking pin.

7. An integrated circuit memory device comprising:

a plurality of banks of memory cells;

a plurality of groups of data input/output pins, a respective group of which corresponds to a respective bank of memory cells;

a plurality of data masking pins, a respective one of which corresponds to a respective bank of memory cells;

a plurality of groups of input/output line pairs, a respective group of which is responsive to a respective group of data input/output pins and to a respective bank of memory cells to input and output data between the plurality of groups of data input/output pins and the plurality of banks of memory cells;

means for generating a pulse in response to a data masking signal that is received on one of the plurality of data masking pins;

means for equalizing the plurality of groups of input/output line pairs during the pulse;

first means for precharging the plurality of groups of input/output line pairs during the pulse; and second means for precharging the corresponding group of input/output lines pairs after the pulse in response to the data masking signal that is received on one of the plurality of data masking pins.

8. An integrated circuit memory device according to claim 7 further comprising:

a plurality of groups of input and output line drivers that drive the corresponding plurality of groups of input/output line pairs; and means for deactivating the plurality of groups of input and output line drivers during the pulse and for activating the plurality of groups of input and output line drivers except for the group of input and output line drivers that correspond to the one of the plurality of data masking pins after the pulse.

9. A method of masking data in an integrated circuit memory device comprising a plurality of banks of memory cells, a plurality of groups of data input/output pins, a respective group of which corresponds to a respective bank of memory cells, a plurality of data masking pins, a respective one of which corresponds to a respective bank of memory cells, and a plurality of groups of input/output line pairs, a respective group of which is responsive to a respective group of data input/output pins and to a respective bank of memory cells to input and output data between the plurality of groups of data input/output pins and the plurality of banks of memory cells, the method of masking data comprising the steps of:

generating a pulse in response to a data masking signal that is received on one of the plurality of data masking pins;

equalizing the plurality of groups of input/output line pairs during the pulse;

precharging the plurality of groups of input/output line pairs during the pulse; and precharging the corresponding group of input/output lines pairs after the pulse in response to the data masking signal that is received on the one of the plurality of data masking pins.

10. A method according to claim 9 wherein the integrated circuit memory device further comprises a plurality of groups of input and output line drivers that drive the corresponding plurality of groups of input/output line pairs, the method further comprising the steps of:

deactivating the plurality of groups of input and output line drivers during the pulse; and activating the plurality of groups of input and output line drivers except for the group of input and output line drivers that correspond to the one of the plurality of data masking pins after the pulse.

* * * * *